(12) United States Patent
Krummacher et al.

(10) Patent No.: US 9,692,004 B2
(45) Date of Patent: Jun. 27, 2017

(54) OPTOELECTRONIC ELEMENT

(71) Applicant: OSRAM OLED GmbH, Regensburg (DE)

(72) Inventors: Benjamin Claus Krummacher, Regensburg (DE); Simon Schicktanz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/909,066

(22) PCT Filed: Jul. 30, 2014

(86) PCT No.: PCT/EP2014/066421
§ 371 (c)(1),
(2) Date: Jan. 29, 2016

(87) PCT Pub. No.: WO2015/014906
PCT Pub. Date: Feb. 5, 2015

(65) Prior Publication Data
US 2016/0204372 A1    Jul. 14, 2016

(30) Foreign Application Priority Data

Jul. 31, 2013  (DE) .................. 10 2013 108 213

(51) Int. Cl.
| H01L 51/52 | (2006.01) |
| H01L 23/00 | (2006.01) |
| H01L 25/04 | (2014.01) |
| H01L 27/32 | (2006.01) |

(52) U.S. Cl.
CPC .............. *H01L 51/52* (2013.01); *H01L 24/01* (2013.01); *H01L 25/048* (2013.01); *H01L 27/3202* (2013.01); *H01L 27/3204* (2013.01); *H01L 51/5203* (2013.01); *H01L 51/524* (2013.01); *H01L 2251/5361* (2013.01); *H01L 2924/0002* (2013.01)

(58) Field of Classification Search
None
See application file for complete search history.

(56) References Cited

U.S. PATENT DOCUMENTS

2010/0052518 A1    3/2010  Jeon et al.

FOREIGN PATENT DOCUMENTS

| DE | 102006060781 A1 | 4/2008 | |
| DE | 102011077687 A1 | 12/2012 | |
| EP | 2442008 A2 | 4/2012 | |
| JP | WO 2013035574 A1 * | 3/2013 | ........... H01L 51/529 |
| KR | 20100113196 A | 10/2010 | |
| WO | 2013/035574 A1 | 3/2013 | |
| WO | 2013/103093 A1 | 7/2013 | |

* cited by examiner

*Primary Examiner* — Joseph Schoenholtz
(74) *Attorney, Agent, or Firm* — McDermott Will & Emery LLP

(57) ABSTRACT

The invention relates to an optoelectronic component with a first substrate, a second substrate, a functional layer stack, a lateral first recess and a first contact surface, the layer stack being arranged between the first substrate and the second substrate. Said layer stack comprises an organically active area for producing electromagnetic radiation, and the component has a first lateral surface. The first recess extends in the lateral direction to the first lateral surface and in the vertical direction through the second substrate.

14 Claims, 8 Drawing Sheets

OPTOELECTRONIC ELEMENT

The present application relates to an optoelectronic component.

An optoelectronic component has a luminous area of limited size. In order to increase a luminous area, a plurality of optoelectronic components are generally used. An easily executable realization of a safe electrical and mechanically stable connection between the optoelectronic components constitutes a technical challenge.

An object is to specify an optoelectronic component which can be mechanically and electrically connected in a simplified manner to other optoelectronic components.

This object is achieved, inter alia, by an optoelectronic component according to the independent claim. Further embodiments and developments are disclosed in the dependent claims.

In accordance with at least one embodiment of the component, the optoelectronic component has a first substrate and a second substrate. The first substrate contains by way of example a material that is made of glass or that consists of glass. Alternatively, the first substrate may be formed in particular as a flexible film. In particular, the first substrate is permeable, preferably transparent, for a visible portion of an electromagnetic radiation. The first substrate has a surface facing away from the second substrate, which surface is formed in particular as a radiation exit face of the optoelectronic component.

The second substrate may be formed in particular as a glass substrate. Alternatively, the second substrate by way of example is a cover film, which protects the component against ambient influences, such as air humidity or oxygen. The second substrate may also be formed as a flexible film.

In accordance with at least one embodiment of the component the component has a functional layer stack. The layer stack is arranged in particular between the first substrate and the second substrate. The layer stack by way of example contains an organic active region. The active region generates in particular an electromagnetic radiation during operation of the component.

In accordance with at least one embodiment of the component the component has a lateral first recess. A recess in the component is to be understood to mean a hole in the component of which the base area is arranged in the component. In particular, the recess is a blind hole in the component. The lateral first recess is arranged on a rear side of the component. The rear side of the component is in particular a surface of the component that delimits the component and that faces away from the radiation exit face of the component. By way of example, the rear side may be a face of the second substrate facing away from the radiation exit face. It is also possible for the recess to be arranged on the radiation exit face.

By way of example, the first recess adjoins a first side face of the component. By way of example, the first side face delimits the component in a lateral direction. A lateral direction is to be understood to mean a direction directed parallel to a primary plane of extension of the first substrate. Here, the first side face may be formed as a flat face formed from side faces of the first substrate, of the functional layer stack, and of the second substrate.

The first recess extends in particular in a lateral direction from the inner region of the component to the first side face. The first recess is formed in the second substrate. The first recess extends in particular through the second substrate in a vertical direction. A vertical direction is to be understood to mean a direction directed perpendicularly to a primary plane of extension of the first substrate. The inner region is a closed region of the component, not adjoining a side face of the component.

In particular, the first recess may extend completely through the second substrate. Here, it is possible for the functional layer stack to be freely accessible and/or electrically contactable in the region of the first recess. It is also possible for the first recess to be located only within the second substrate.

By way of example, the first substrate, the functional layer stack and the second substrate may be arranged one above the other in the vertical direction. The functional layer stack may then be located on a side of the first substrate facing away from the radiation exit face. The second substrate may be located on a side of the functional layer stack facing away from the first substrate.

In at least one embodiment an optoelectronic component has a first substrate, a second substrate, a functional layer stack, a lateral first recess, and a first contact face. The layer stack is arranged between the first substrate and the second substrate. The layer stack has an organic active region provided for the generation of electromagnetic radiation. The component additionally has a first side face, wherein the first recess extends in the lateral direction as far as the first side face and in the vertical direction through the second substrate.

The optoelectronic component is electrically contactable externally in particular via the first contact face. By way of example, the first contact face is freely accessible and/or electrically contactable for the electrical contacting of the component in the first recess. By way of example, the first contact face is applied to a cover face of the functional layer stack facing away from the first substrate. The first recess is provided in particular in order to receive a connection element mechanically connecting the optoelectronic components to one another.

By means of the lateral first recess, an optoelectronic component can be mechanically connected in a stable and flush manner by means of a connection element to a further optoelectronic component, which likewise has a lateral recess. Here and hereinafter, "mechanically stable" may mean that the at least two optoelectronic components are mechanically fixedly connected to one another via the connection element and that no further mechanically stabilizing and/or supporting components are required in order to enable a mechanical handling of the interconnected, adjacent optoelectronic components. In particular, the connection element engages with the recesses of the components to be connected, such that the connection element is anchored to the optoelectronic component. In particular, the connection element may be embodied in such a way that the connection element is matched to the recesses in terms of shape and size, such that a particularly mechanically stable connection is realized between the adjacent components.

The term "matched in shape and size" may mean here and hereinafter that the spatial expansions of the first recess and of the connection element vary from one another by at most 10%, preferably at most 5%. Furthermore, the term "matched in shape and size" may mean that the first recess and the connection element in a plan view vary in their shape and their size by at most 10%, preferably at most 5%. The connection element in a plan view may preferably be larger than the first recess. In this case the connection element by way of example can be pressed into the first recess under application of a pressing force in order to produce a mechanically stable connection between two components.

It is alternatively or additionally possible for a filling material to be poured additionally into the common recess. An embodiment of this type may increase the mechanical stability of the connection between components and may protect the connection point against external ambient influences. Alternatively, the common recess may serve as a soldering point. By way of example, the vertical expansion of the connection element is smaller than the vertical depth of the common recess.

In accordance with at least one embodiment of the component the first recess in plan view in a direction extending parallel to the first side face in a first position relative to the first side face has a greater expansion than in a second position arranged between the first position and the first side face. In plan view of the first substrate the expansion of the first recess extending parallel to the first side face varies from an inner region of the component to the first side face at least in regions, whereby the first recess is formed in particular as a lateral anchoring structure of the component.

In accordance with at least one variant of the component a border of the first recess in plan view of the first substrate extends perpendicularly to the side face in a region adjoining the side face. The first recess thus has a constant lateral expansion in particular in the region adjoining the side face. If a connection element engages with the first recess, the connection element is not anchored directly at the side face, but in the inner region of the component, such that the first recess forms a particularly stable anchoring structure.

In accordance with at least one embodiment of the component the first recess in plan view is mushroom-shaped, T-shaped, arrow-shaped, bottleneck-shaped or trapezoidal, at least in regions. Such shapes of the first recess provide a connection element with particularly good anchoring possibilities.

In accordance with at least one embodiment of the component the first contact face is accessible for electrical contacting of the component in the first recess. The first contact face may preferably be freely accessible in the first recess. In particular, a base area of the first recess is formed by the first contact face. The first contact face may be formed as an anode or as a cathode.

In accordance with at least one embodiment of the component the first contact face covers the side face at least in regions. In particular, the first contact face may be formed such that the first contact face extends from the first side face into the first recess. Alternatively, the first contact face adjoins the recess. The first recess is in particular free from the contact face. It is conceivable for the first contact face to be spatially distanced from the first recess.

In accordance with at least one embodiment of the component the component has a lateral second recess. The second recess is arranged on the rear side of the component. In particular, the second recess may be formed on the same side of the component as the first recess. In particular, the second recess extends in the lateral direction as far as a second side face of the component. The second recess extends in particular through the second substrate in the vertical direction. The second side face by way of example faces away from the first side face. In particular, the second side face is directed parallel to the first side face. It is also conceivable for the second side face to be a lateral surface of the component adjoining the first side face and directed in particular orthogonally to the first side face. Here, the second side face may be formed as a flat face formed from side faces of the first substrate, of the functional layer stack, and of the second substrate.

In accordance with at least one embodiment of the component the component has a second contact face. The second contact face may be formed as an anode or as a cathode. The optoelectronic component is electrically contactable in particular via the first contact face and second contact face. By way of example, the second contact face is applied to the cover face of the functional layer stack. The second contact face may also be electrically separated from the first contact face. A base area of the second recess may be formed by the second contact face.

The second contact face is associated by way of example with the second recess. A contact face associated with the recess is to be understood to mean a contact face arranged at least in regions in the recess or covering a side face of the component at least in regions, wherein the recess associated with the contact face extends in the lateral direction as far as this side face.

In accordance with at least one embodiment of the component the first recess and the second recess differ in their shape for characterization of the polarity of the electrical voltage to be applied to the contact faces. In particular, a contact face associated with the first recess is an anode of the component and a contact face associated with the second recess is a cathode of the component, or vice versa. A characterization of the polarity by the shape of the recess facilitates a safe construction of an arrangement of a plurality of optoelectronic components. As a result of the characterization, an incorrect connection in respect of the polarity of the voltage to be applied can be avoided in a simple way. The different shapes of the recesses thus serve to protect the optoelectronic components against reversed polarity.

In accordance with at least one embodiment of the component the component has a plurality of first recesses and a plurality of second recesses. At least one of the first recesses is associated with the first contact face. At least one of the second recesses is associated with the second contact face. In particular, a plurality of first recesses or a plurality of second recesses can be associated with the first contact face or the second contact face. The component is in particular electrically contactable externally via any pair formed from a first contact face and a second contact face.

In accordance with at least one embodiment an arrangement has a plurality of optoelectronic components and at least one connection element. The components are arranged such that a recess in a first component adjoins a recess in a second component adjacent to the first component, whereby a common recess in the adjacent components is formed. The connection element and the common recess have shapes and sizes matched to one another, such that the connection element engages with the common recess and mechanically connects the components to one another.

In accordance with at least one variant of the component the first recess has a first cross section on the side face. Here, the cross section may be provided perpendicularly to the primary plane of extension. The second recess has a second cross section on the second side face. The first cross section and the second cross section are congruent in particular.

By means of such an embodiment of the recesses, the common recess can be formed, such that the border thereof at an interface between two adjacent components is continuous, i.e. free from edges. A continuous course of the common recess at the interface facilitates production of the connection element, of which the geometry is matched in terms of the shape and size of the common recess. In particular, the connection element has a vertical expansion smaller than or equal to a vertical depth of the common recess. The connection element may thus be arranged completely in the recess.

In accordance with at least one embodiment of the arrangement the connection element is stretchy. Here, it is possible for the connection element to be stretched during the connection, whereby the connection element provided in the arrangement of the components has an elongation. Here, "stretchy" may mean that the material of the connection element has a proof stress or a yield strength that is shorter than the distance of the optoelectronic component prior to the connection. By way of example, the proof stress or the yield strength is at least 5 µm. Due to the elongation of the connection element arranged in the common recess, the adjacent components are pressed against one another by a tensile force directed oppositely to the elongation. A particularly mechanically stable connection between adjacent components can be obtained by an embodiment of this type of the connection element.

In accordance with at least one embodiment of the arrangement the connection element is electrically insulating. The electrical connection between at least two adjacent components can be realized via the side faces of the components. In particular, the components each have a contact face on the side face, wherein the contact face of a first component adjoins the contact face of a second component, such that an electrical connection is established between the components.

In accordance with at least one embodiment of the arrangement the connection element is electrically conductive on its side facing toward the components. The connection element for example has an electrically conductive connection layer. In particular, the adjacent components in the recesses forming the common recess each have a contact face, wherein the contact faces of the adjacent components are electrically connected to one another by means of the connection layer of the connection element.

Further preferred embodiments and developments of the optoelectronic component and of the arrangement comprising a plurality of components will emerge from the exemplary embodiments explained hereinafter in conjunction with FIGS. 1 to 11, in which:

FIG. 3A to FIG. 5 show schematic illustrations of further exemplary embodiments of an optoelectronic component, FIGS. 6A to 8 show schematic illustrations of different exemplary embodiments of an arrangement of components, FIGS. 9A to 10C show schematic illustrations of different exemplary embodiments of an arrangement of components having different shapes of the lateral recess.

Identical, equivalent or similarly acting components are provided in the figures with like reference signs. The figures are each schematic illustrations and therefore are not necessarily true to scale. Rather, comparatively small components and in particular layer thicknesses may be illustrated in an exaggerated manner for clarification.

Figure 1:
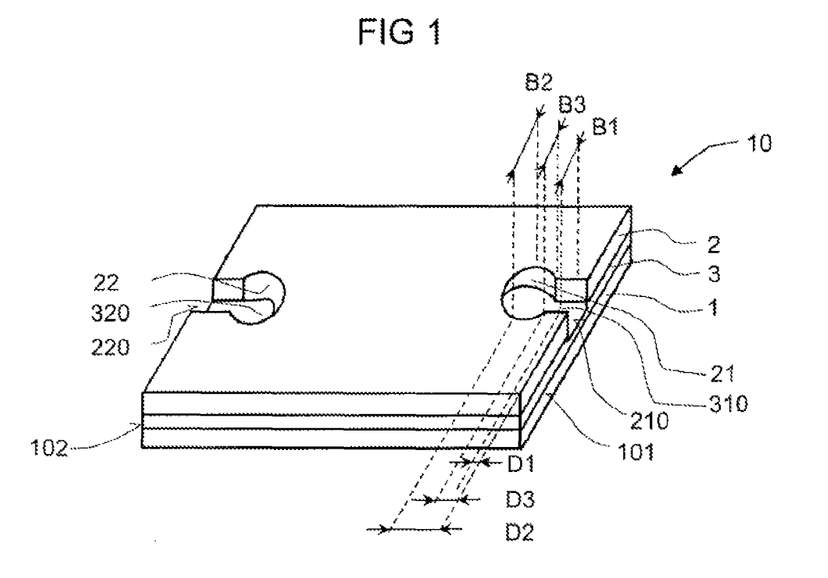
FIG. 1 shows a schematic illustration of an exemplary embodiment of an optoelectronic component.

An exemplary embodiment of an optoelectronic component is illustrated schematically in FIG. 1. The optoelectronic component 10 has a first substrate 1, a second substrate 2 and a functional layer stack 3. The functional layer stack 3 is arranged between the first substrate 1 and the second substrate 2.

Figure 2:
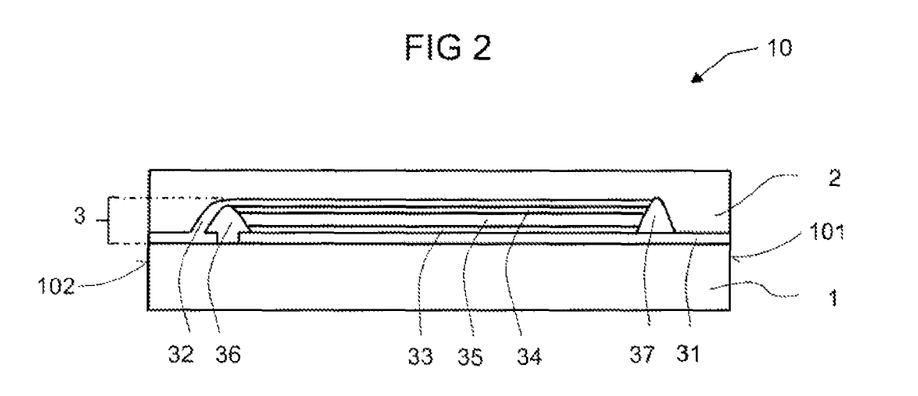
FIG. 2 shows an exemplary embodiment of an optoelectronic component in a schematic sectional view.

A schematic structure of the layer stack 3 is illustrated for example in FIG. 2. The functional layer stack 3 may for example comprise a plurality of layers containing organic polymers, organic oligomers, organic monomers, organic non-polymeric molecules, or combinations thereof. The functional layer stack 3 has an active region 35. The active region 35 emits an electromagnetic radiation during operation of the component, for example in the ultraviolet, visible or infrared spectral range. In particular, the active region 35 contains at least one organic active layer. The layer stack 3 contains a first charge transport layer 33 and a second charge transport layer 34. The first charge transport layer 33, the second charge transport layer 34 and the active region 35 are arranged between a first insulating structure 36 and a second insulating structure 37. The first charge transport layer 33 adjoins a first terminal layer 31 of the layer stack 3. The second charge transport layer 34 adjoins a second terminal layer 32 of the layer stack 3.

In particular, the first substrate 1 is permeable for radiation, particularly preferably transparent for radiation. The first substrate 1 may contain glass or consists of glass. The first substrate by way of example has a surface which faces away from the layer stack 3 and is formed as a radiation exit face of the component.

The second substrate 2 may be formed as a glass substrate. Alternatively, the second substrate may be formed as a cover layer, for example a film. It is also conceivable for the first substrate 1 and the second substrate 2 to be formed resiliently and so as to be stretchy.

The optoelectronic component 10 has a first side face 101 and a second side face 102 facing away from the first side face 101. The two side faces delimit the component 10 in two lateral directions.

In FIG. 1 the component has a lateral first recess 21. The first recess 21 extends in the lateral direction as far as the first side face 101. The first recess extends through the second substrate in the vertical direction. It is also conceivable for the recess to form a blind hole in the second substrate. In the plan view of the first substrate 1 the first recess at a first distance D1 from the first side face 101 has a first expansion B1 extending parallel to the side face. At a second distance D2 from the first side face 101 the first recess has a second expansion B2 extending parallel to the first side face 101. The second distance D2 is greater than the first distance D1. The second expansion B2 is greater than the first expansion B1. This means that the first recess 21 in a first position relative to the side face 101 has a greater lateral expansion than in a second position arranged between the first position and the side face 101. The first recess 21 thus forms an anchoring structure for a connection element arranged in the first recess.

The first recess has a border, which in plan view extends perpendicularly to the side face in a region adjoining the side face 101. In FIG. 1 the first recess at a third distance D3 from the first side face 101 has a third expansion B3 extending parallel to the first side face 101. Here, the third distance D3 is greater than the first distance D1 and smaller than the second distance D2. The third expansion B3 and the first expansion B1 are of equal size. The first recess 21 has a constant expansion between the first distance D1 and the third distance D3.

The optoelectronic component contains a first contact face 310. The first contact face is accessible in the first recess 21.

In particular, the first contact face 310 is a portion of the first terminal layer 31 or the second terminal layer 32 exposed in the first recess.

The component 10 has a lateral second recess 22. The second recess extends in the lateral direction from an inner region of the component to the second side face 102. The first recess 21 and the second recess 22 thus each form an opening on a rear side of the component, of which the inner wall is open to the first side face 101 or to the second side face 102 respectively. The second recess extends through the second substrate in the vertical direction. In plan view of the first substrate 1, the first recess 21 and the second recess 22 have the same geometry, for example the same shape and same size.

The component 10 has a second contact face 320. The second contact face 320 is accessible in the second recess. A base area of the second recess 22 is formed by the second contact face 320. The second contact face 320 is in particular an exposed portion of the first terminal layer 31 or the second terminal layer 32. The optoelectronic component 10 is electrically contactable externally in particular via the first contact face 310 and the second contact face 320.

The first recess 21 has on the first side face 101 a first cross section 210. The second recess 22 has on the second side face 102 a second cross section 220. The first cross section 210 and the second cross section 220 have the same shape and same size. This means that the first cross section 210 and the second cross section 220 are congruent in side view.

Figure 3A:
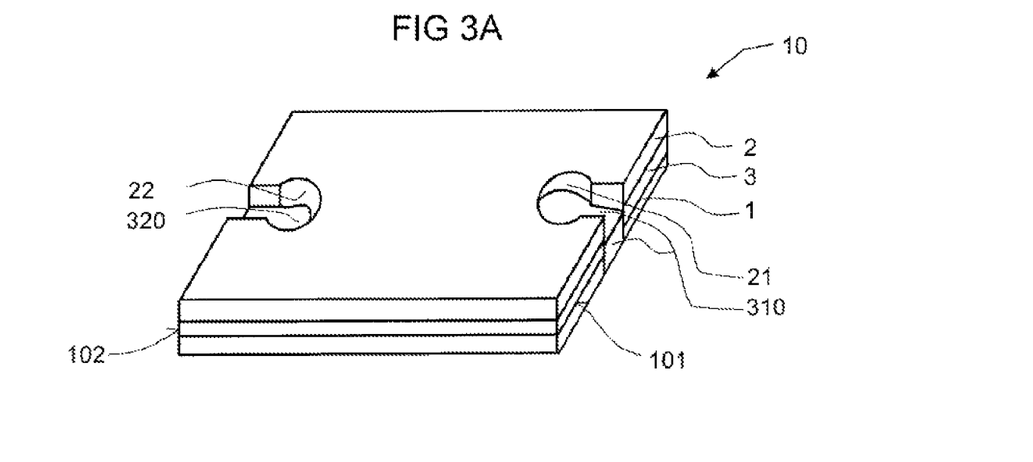

A further exemplary embodiment of an optoelectronic component 10 is illustrated schematically in FIG. 3A. This exemplary embodiment corresponds substantially to the exemplary embodiment of an component in FIG. 1. In contrast thereto, the component 10 has a first contact face 310, which covers the first side face 101 in regions. The first contact face 310 extends from the side face 101 into the first recess 21. The second contact face 320 may be formed similarly to the first contact face 310.

Figure 3B:
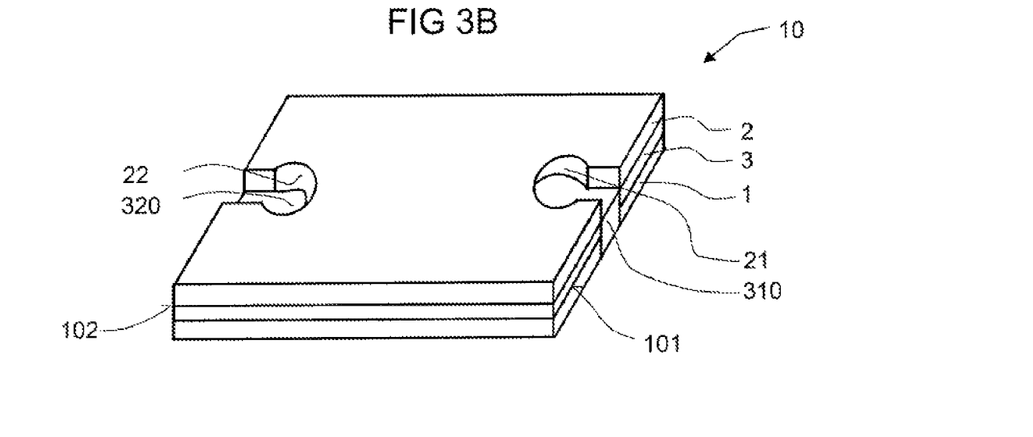

A further exemplary embodiment of an optoelectronic component is illustrated schematically in FIG. 3B. This exemplary embodiment corresponds substantially to the exemplary embodiment of an component in FIG. 3A. In contrast thereto, the first recess is free from the first contact face 310. The first contact face adjoins the first recess. It is also conceivable for the first contact face 310 arranged on the first side face 101 to be spatially distanced from the first recess 21.

Figure 4:
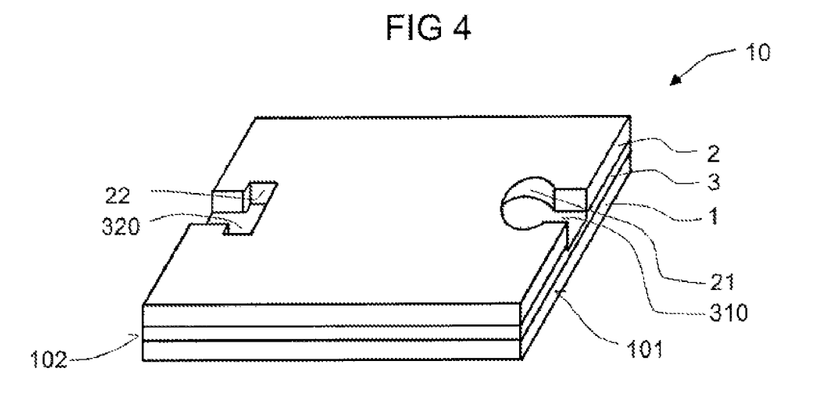

A further exemplary embodiment of an optoelectronic component 10 is illustrated schematically in FIG. 4. This exemplary embodiment corresponds substantially to the exemplary embodiment of an component in FIG. 1. In contrast thereto, the first recess 21 and the second recess 22 differ in terms of their shape in plan view. In FIG. 4 the first recess 21 is mushroom-shaped. The second recess 22 is T-shaped. The different shapes of the first recess 21 and the second recess 22 are provided for the characterization of the polarity of the electrical voltage to be applied to the contact faces 310 and 320. The component can be protected against reversed polarity by the characterization of the recesses in respect of the polarity of the electrical voltage to be applied to the contact faces. A cross section of the first recess 21 and a cross section of the second recess are in particular congruent in side view.

Figure 5:
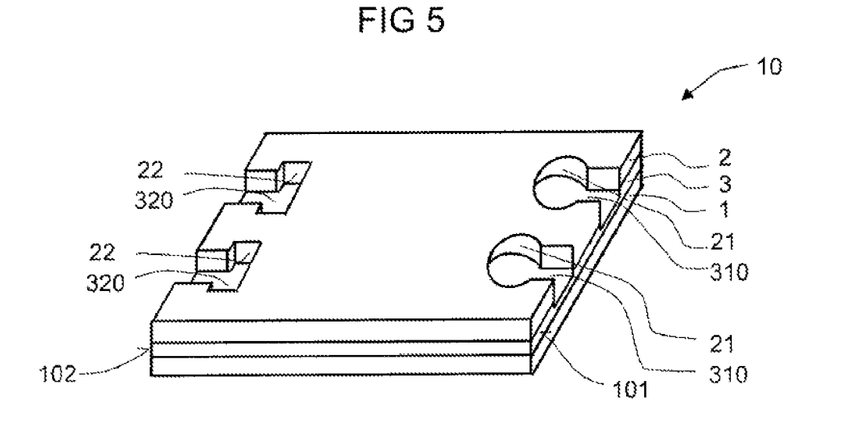

A further exemplary embodiment of an optoelectronic component is illustrated schematically in FIG. 5. This exemplary embodiment corresponds substantially to the exemplary embodiment of an component in FIG. 4. In contrast thereto, the component has two first recesses 21 and two second recesses 22. In a deviation herefrom, the component may have more than two first recesses 21 and more than two second recesses 22. The first recesses 21 are each associated with a first contact face 310. The second recesses 22 are each associated with a second contact face 320. The component 10 is electrically contactable externally for example via any pair comprising a first contact face and a second contact face. Two such components 10 may be electrically connected in series in a simplified manner by means of at least one connection element. Such components may be connected to one another by means of a plurality of connection elements, whereby the mechanical stability of the connection between the components is additionally increased.

It is also conceivable for the first recesses 21 to differ in terms of their shape. By way of example, a first recess 21 is mushroom-shaped and the other recess 21 is T-shaped. If the first recesses 21 of different shapes are associated with different contact faces 310 and 320, the component has at least one anode and one cathode of the component on the side of the first side face 101. If the second recesses 22 differ in terms of their shape similarly to the first recesses 21, the component likewise has at least one anode and one cathode of the component on the side of the second side face 102. Two such components can thus be electrically connected in parallel in a simplified manner by means of in particular two connection elements.

Figure 6A:
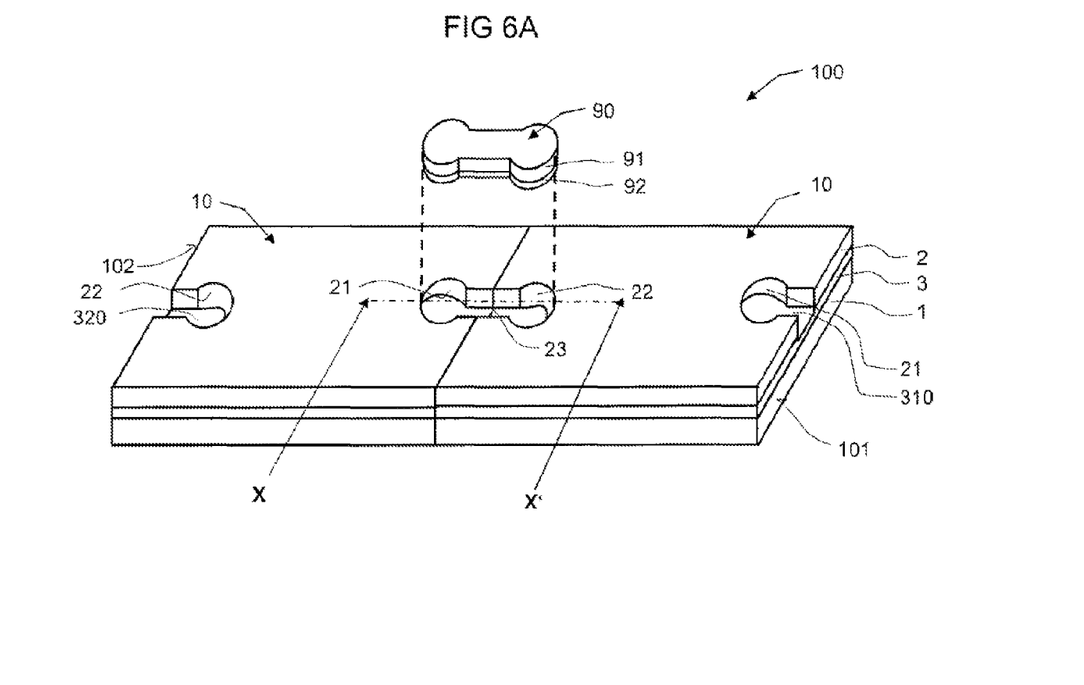

An exemplary embodiment of an arrangement comprising two optoelectronic components 10 and a connection element 90 is illustrated schematically in FIG. 6A. The components illustrated in FIG. 6A correspond to the optoelectronic component described in FIG. 1. The components 10 are arranged side by side, such that a first recess 21 of a first component adjoins a second recess 22 of a second component, and a common recess 23 of the components is thus formed. A first contact face 310 and a second contact face 320 are accessible in the common recess 23. The components are mechanically connected to one another in a flush manner by means of the connection element 90. In particular, the first substrates 1 and/or the second substrates 2 of the components are arranged flush in relation to one another. The connection element 90 has a geometry matched to a geometry of the common recess 23. This means in particular that the connection element and the common recess 23 have the same shape and same size. The recesses 21 and 22 have congruent cross sections on the side faces. The common recess 23 is thus formed continuously at an interface between the components, i.e. in particular is free from edges.

The connection element 90 contains a body 91 and an electrically conductive connection layer 92. The contact faces 310 and 320 are electrically connected via the connection layer 92. In particular, the connection element 90 is stretchy. By way of example, the connection element 90 has a vertical expansion that is smaller than or equal to a vertical depth of the common recess 23. In order to fasten the adjacent components, the connection element 90 engages with the common recess 23. Due to the matched shapes and sizes, the connection element 90 is anchored in the common recess 23, whereby the components are mechanically connected to one another in a stable manner.

It is also conceivable for a filling material to be poured additionally into the common recess 23 with the connection element 90 arranged in the common recess. An embodiment of this type increases the mechanical stability of the connection between the components and protects the connection point against external ambient influences. Alternatively, the common recess may serve as a soldering point. By way of example, the vertical expansion of the connection element 90 is smaller than the vertical depth of the common recess 23. A thickness of the connection layer, for example a solder layer, is in particular the difference in height from the vertical depth and the vertical expansion.

Figure 6B:
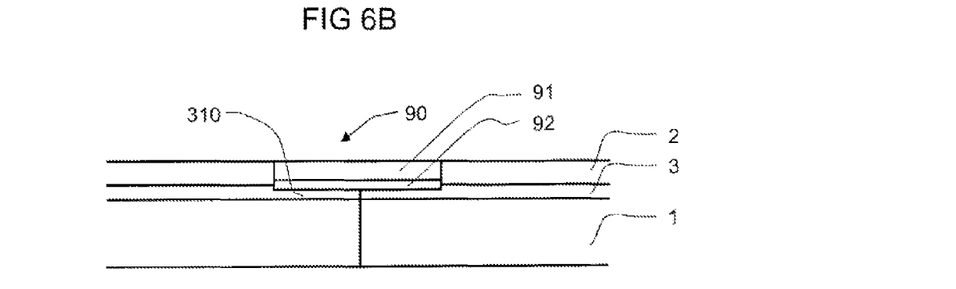

A detail along a line XX' shown in FIG. 6A is illustrated schematically in sectional view in FIG. 6B. The contact faces 310 and 320 accessible in the common recess 23 are electrically connected by means of the connection layer 92 of the connection element. In particular, the contact faces 310 and 320 may each be a region of the first connection layer 31 or of the second connection layer 32, wherein the region is exposed in the respective recesses 21 and 22.

Figure 7A:
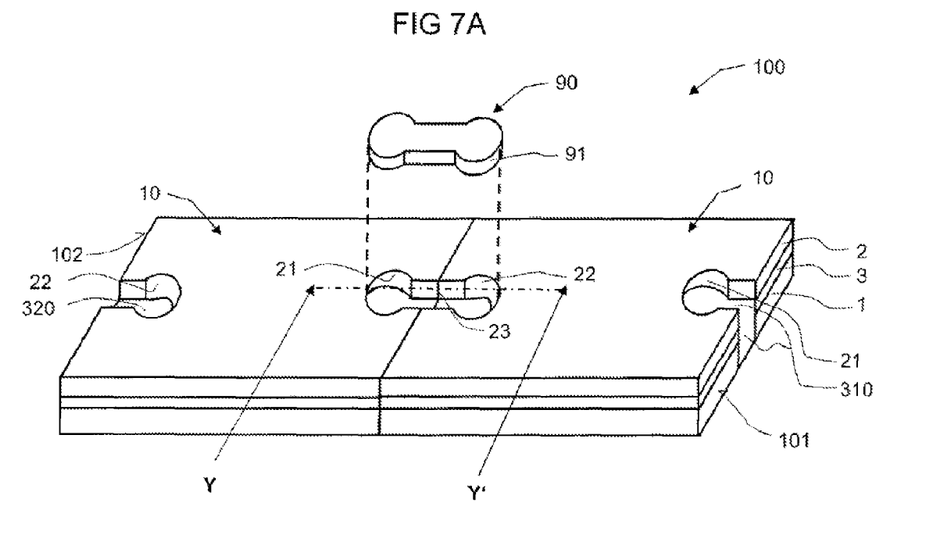

A further arrangement comprising two components 10 and a connection element 90 is illustrated schematically in FIG. 7A. The arrangement illustrated in FIG. 7A corresponds substantially to the arrangement described in FIG. 6A. In contrast hereto, the contact faces 310 and 320 each cover the side face 101 or 102 in regions. The connection element 90 is free from an electrically conductive connection layer. In particular, the connection element 90 is electrically insulating. By way of example, the connection element 90 is stretchy. The adjacent components 10 are pressed against one another by way of example by a tensile force directed oppositely to the elongation of the connection element 90. The electrical connection between the adjacent components is realized via the side faces 101 and 102 of the components. Due to the resilience of the connection element and the tensile force directed oppositely to the elongation of the connection element, a reliable electrical connection is produced via the side faces of the components. Here, the connection element 90 may be smaller than the common recess. In particular, the connection element 90 has a maximum lateral expansion that is at most 95%, preferably at most 90%, or at most 85% of a maximum lateral expansion of the common recess.

Figure 7B:
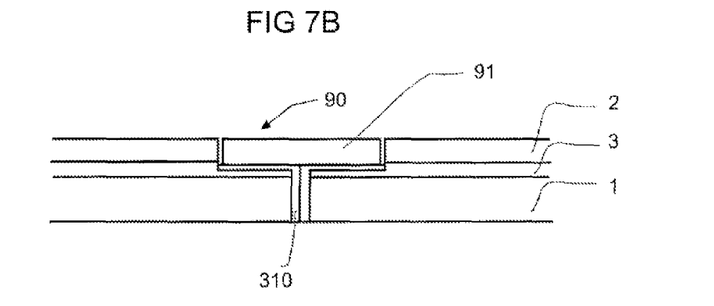

A detail along a line YY' shown in FIG. 7A is illustrated schematically in sectional view in FIG. 7B. The contact faces 310 and 320 each extend from a side face in a recess in an optoelectronic component 10. In a deviation herefrom, it is also conceivable for the contact faces 310 and 320 to each cover a side face at least in regions, wherein the recesses are free from the contact faces.

Figure 8:
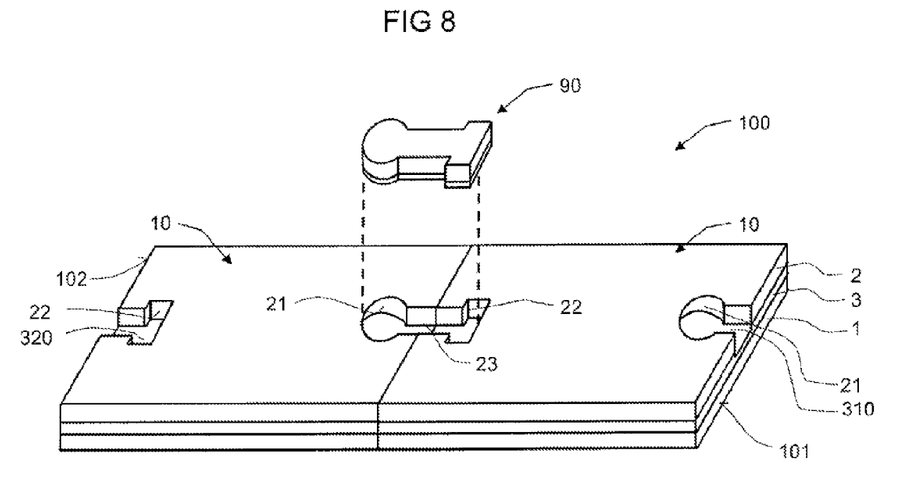

A further exemplary embodiment of an arrangement comprising two components 10 and a connection element 90 is illustrated schematically in FIG. 8. This exemplary embodiment corresponds substantially to the exemplary embodiment in FIG. 6A, in which the components 10 correspond to the component described in FIG. 1. In contrast hereto, the components 10 illustrated in FIG. 8 correspond to the component described in FIG. 4, of which the recesses 21 and 22 differ in terms of their shape in order to characterize the polarity of the electrical voltage to be applied to the contact faces 310 and 320 associated with the recesses. In FIG. 8 two recesses having different shapes form a common recess 23. The connection element 90 has a geometry matched to the geometry of the common recess 23.

Further exemplary embodiments of an arrangement comprising components that have recesses of different shapes are described in FIGS. 9A to 10C.

Figure 9A:
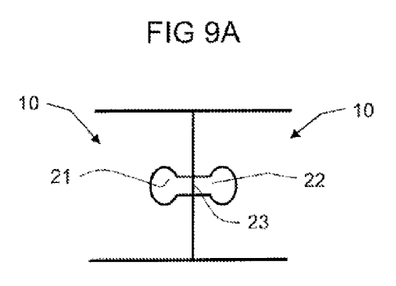
Figure 9B:
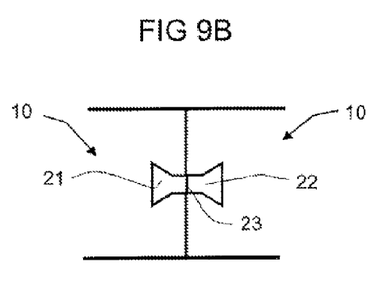
Figure 9C:
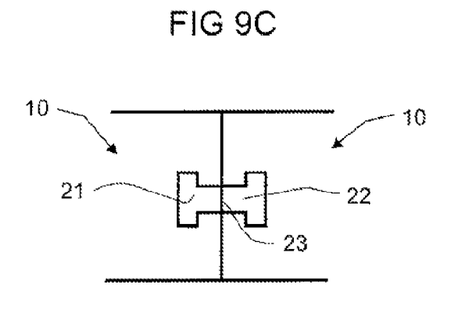
Figure 9D:
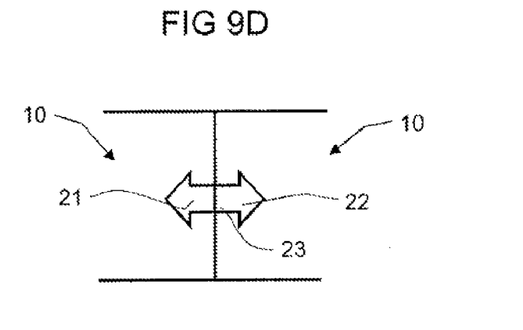

In FIG. 9A the recesses are each mushroom-shaped. The common recess 23 has the shape of a bone. In FIG. 9B the recesses 21 and 22 are each bottleneck-shaped. The common recess 23 is formed in the shape of an egg timer. In FIG. 9C the recesses 21 and 22 are each T-shaped. The common recess 23 is H-shaped. In FIG. 9D the recesses 21 and 22 are each arrow-shaped. The common recess 23 is formed in the shape of a double-headed arrow.

Figure 10A:
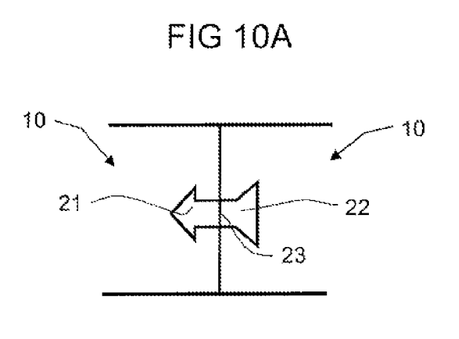
Figure 10B:
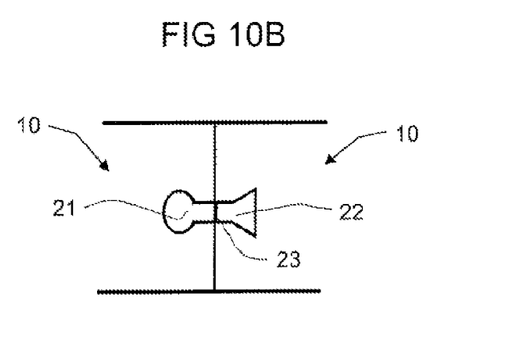
Figure 10C:
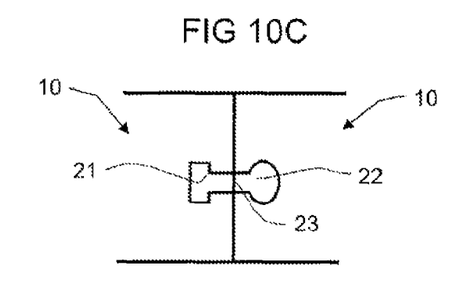

In FIGS. 10A to 10C the common recess 23 is formed by two recesses 21 and 22, wherein the two recesses 21 and 22 have different shapes. The recesses 21 and 22 are each arrow-shaped, bottleneck-shaped, trapezoidal, mushroom-shaped or T-shaped.

Figure 11:
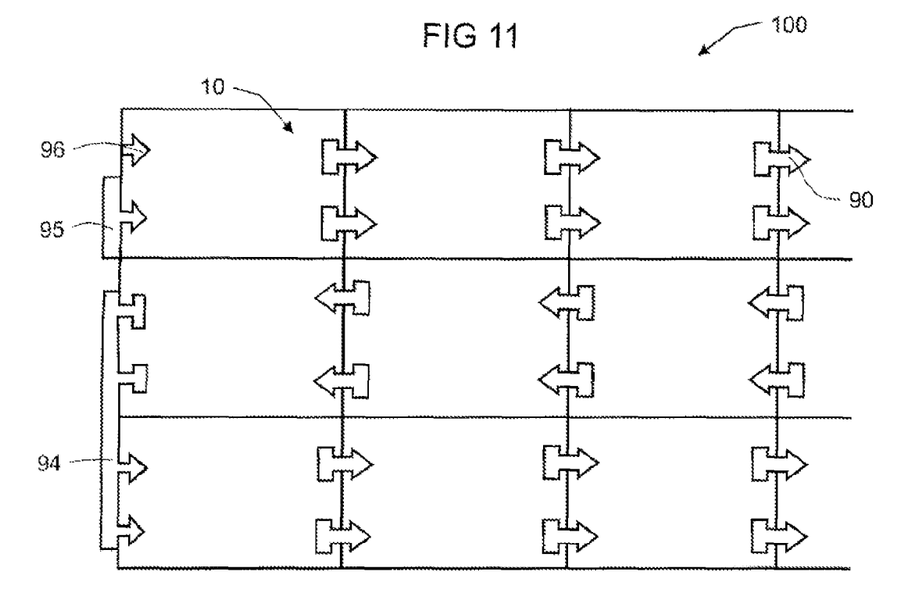
FIG. 11 shows an exemplary embodiment of an arrangement comprising a plurality of optoelectronic components and a plurality of connection elements.

A further exemplary embodiment of an arrangement 100 comprising a plurality of optoelectronic components 10 and a plurality of connection elements 90 is described in FIG. 11. The components 10 correspond substantially to the component illustrated in FIG. 5.

The components 10 are arranged in a plurality of rows and columns. The components 10 within a row are mechanically connected by a plurality of connection elements 90. In FIG. 11 the components within a row are connected in series. A direction of the flow of current can be characterized by the shape of the arranged connection elements 90.

Two adjacent components 10 within a column at the edge of the arrangement are electrically and mechanically connected by a connection strut 94. The connection strut 94 has protruding portions of which the geometry is matched to the geometry of the recesses 21 and 22. The recesses located at the edge of the arrangement and which are not intended for a mechanical or electrical connection between the components are covered by a protective edge strip 95 or by a protection component 96. The protective edge strip and the protection component are provided in particular for the insulation of the contact faces and at least in regions have a geometry that is matched to a geometry of the recess to be covered or the recesses to be covered.

The present application claims the priority of the German application DE 10 2013 108 213.0, of which the disclosure is hereby incorporated by reference.

The invention is not limited to the exemplary embodiments as a result of the description of the invention on the basis of said exemplary embodiments. Rather, the invention includes any novel feature and any combination of features in particular including any combination of features in the claims, even if this feature or this combination itself is not explicitly specified in the claims or exemplary embodiments.

The invention claimed is:

1. An optoelectronic component comprising:
   a first substrate;
   a second substrate;
   a functional layer stack; and
   a lateral first recess,
   wherein the layer stack is arranged between the first substrate and the second substrate,
   wherein the layer stack has an organic active region provided for the generation of electromagnetic radiation,
   wherein the component has a first side face,
   wherein the first recess extends in the lateral direction as far as to the first side face and in the vertical direction into or through the second substrate, and
   wherein the first recess is formed according to one of following features (i) or (ii):
      (i) the first recess in plan view in a direction extending parallel to the first side face in a first position relative to the first side face has a greater expansion than in a second position arranged between the first position and the first side face, or
      (ii) the first recess in plan view is mushroom-shaped, T-shaped, arrow-shaped, bottleneck-shaped, or trapezoidal, at least in regions.

2. The optoelectronic component according to claim 1, wherein a border of the first recess in plan view extends perpendicularly to the side face in a region adjoining the side face.

3. The optoelectronic component according to claim 1, wherein a first contact face is accessible in the first recess for electrical contacting of the component.

4. The optoelectronic component according to claim 3, wherein the first recess extends completely through the second substrate, and
wherein a base area of the first recess is formed by the first contact face.

5. The optoelectronic component according to claim 1, wherein a first contact face covers the first side face at least in regions.

6. An optoelectronic component comprising:
a first substrate;
a second substrate;
a functional layer stack; and
a lateral first recess,
wherein the layer stack is arranged between the first substrate and the second substrate,
wherein the layer stack has an organic active region provided for the generation of electromagnetic radiation,
wherein the component has a first side face,
wherein the first recess extends in the lateral direction as far as to the first side face and in the vertical direction into or through the second substrate,
wherein the component has a second side face and a lateral second recess, which extends in the lateral direction from an inner region of the optoelectronic component as far as to the second side face and in the vertical direction through the second substrate, and
wherein the first recess and the second recess differ in their shape for the characterization of the polarity of the electrical voltage to be applied to the optoelectronic component.

7. The optoelectronic component according to claim 6, wherein the component has a contact face, which covers the second side face at least in regions or is accessible in the second recess for electrical contacting of the component.

8. The optoelectronic component according to claim 7, wherein the second recess extends completely through the second substrate, and
wherein a base area of the second recess is formed by the contact face.

9. The optoelectronic component according to claim 1, wherein the component has a plurality of first recesses and a plurality of second recesses,
wherein at least one of the first recesses is associated with a first contact face,
wherein at least one of the second recesses is associated with a second contact face, and
wherein the component is electrically contactable externally via the first contact face and a second contact face.

10. The optoelectronic component according to claim 6, wherein the first recess has a first cross section on the first side face,
wherein the second recess has a second cross section on the second side face, and
wherein the first cross section and the second cross section have the same shape and same size.

11. An arrangement comprising:
at least one connection element; and
a plurality of electrically interconnected optoelectronic components, each of the optoelectronic components comprising a first substrate, a second substrate, a functional layer stack, and a lateral first recess,
wherein the layer stack is arranged between the first substrate and the second substrate,
wherein the layer stack has an organic active region provided for the generation of electromagnetic radiation,
wherein each of the optoelectronic components has a first side face,
wherein the first recess extends in the lateral direction as far as to the first side face and in the vertical direction into or through the second substrate,
wherein the components are arranged side by side, such that a recess of a first component adjoins a recess of a second component adjacent to the first component, whereby a common recess of the adjacent components is formed, and
wherein the connection element and the common recess have shapes and sizes matched to one another, such that the connection element engages with the common recess and mechanically connects the adjacent components to one another.

12. The arrangement according to claim 11, wherein the connection element is stretchy and the adjacent components are pressed against one another by a tensile force directed oppositely to the elongation of the connection element.

13. The arrangement according to claim 11, wherein the connection element is electrically insulating and the electrical connection between at least two adjacent components is realized via the side faces.

14. The arrangement according to claim 11, wherein the connection element has an electrically conductive connection layer, and
wherein contact faces of the adjacent components are electrically connected to one another by means of the connection layer.

* * * * *